United States Patent
Yang et al.

(10) Patent No.: US 7,544,608 B2
(45) Date of Patent: Jun. 9, 2009

(54) POROUS AND DENSE HYBRID INTERCONNECT STRUCTURE AND METHOD OF MANUFACTURE

(75) Inventors: Chih-Chao Yang, Poughkeepsie, NY (US); Keith Kwong Hon Wong, Wappingers Falls, NY (US); Haining Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 114 days.

(21) Appl. No.: 11/458,464

(22) Filed: Jul. 19, 2006

(65) Prior Publication Data

US 2008/0122109 A1 May 29, 2008

(51) Int. Cl.
*H01L 21/00* (2006.01)
(52) U.S. Cl. .................. 438/638; 438/639; 257/758; 257/760
(58) Field of Classification Search .......... 438/638, 438/639; 257/758, 760
See application file for complete search history.

(56) References Cited

U.S. PATENT DOCUMENTS

| | | | |
|---|---|---|---|
| 5,668,398 A | 9/1997 | Havemann et al. | |
| 5,936,295 A * | 8/1999 | Havemann et al. | 257/522 |
| 5,969,422 A * | 10/1999 | Ting et al. | 257/762 |
| 6,140,221 A | 10/2000 | Annapragada et al. | |
| 6,528,409 B1 * | 3/2003 | Lopatin et al. | 438/618 |
| 6,660,619 B1 * | 12/2003 | Pangrle et al. | 438/586 |
| 6,677,680 B2 * | 1/2004 | Gates et al. | 257/758 |
| 6,831,364 B2 | 12/2004 | Dalton et al. | |
| 6,972,251 B2 | 12/2005 | Ning | |
| 6,995,439 B1 * | 2/2006 | Hill et al. | 257/396 |
| 2008/0038923 A1 * | 2/2008 | Edelstein et al. | 438/703 |

* cited by examiner

*Primary Examiner*—Fernando L Toledo
(74) *Attorney, Agent, or Firm*—Rosa S. Yaghmour; Greenblum & Bernstein P.L.C.

(57) ABSTRACT

A method for manufacturing a structure includes depositing a dense dielectric over the entire wafer, which includes areas that require low dielectric capacitance and areas that require high mechanical strength. The method further includes masking areas of the dense dielectric over the areas that require high mechanical strength and curing unmasked areas of the dense dielectric to burn out porogens inside the dense dielectric and transform the unmasked areas of the dense dielectric to porous dielectric material. A semiconductor structure comprises porous and dense hybrid interconnects for high performance and reliability semiconductor applications.

17 Claims, 14 Drawing Sheets

(Cross-sectional View)

(Layout (Top-down View))

POROUS AND DENSE HYBRID INTERCONNECT STRUCTURE AND METHOD OF MANUFACTURE

FIELD OF THE INVENTION

The invention generally relates to semiconductor structures and methods of manufacturing such structures, and more particularly to porous and dense hybrid interconnect structures for high performance and reliability semiconductor applications and methods of manufacturing such structures.

BACKGROUND DESCRIPTION

In order to reduce the back end of line (BEOL) interconnect portion of a circuit delay, a conventional silicon dioxide dielectric (k of approximately 4.0) has been replaced with dense lower-k films with a k value of approximately 3.0. However, for further performance improvements, more dielectric capacitance reduction is required (k<2.5) for advanced devices.

Capacitance improvements can be made with porous low k dielectrics; however, porous low k dielectric materials have relatively weak mechanical properties as compared to dense dielectrics. It is also a significant challenge for the current BEOL process to integrate these porous low k dielectrics with other module processes. For example, the conventional chemical mechanical process (CMP) has difficulty polishing a low mechanical-module porous dielectric.

By way of further explanation, in conventional methods, a dielectric is deposited on a substrate. In known methods, the dielectric may be, for example, SiLK, SiCOH, $SiO_2$, etc. The dielectric is patterned using conventional lithography and etching processes. A diffusion layer is lined into the patterned dielectric. The diffusion layer may be, for example, a Cu diffusion barrier consisting of Ta(N), Ti(N) or Ru(N). An interconnect structure is then deposited over the diffusion barrier (e.g., liner). The interconnect may consist of any conventional material such as, for example, Cu, Al, Cu(Al). After removing extra interconnect material by chemical-mechanical-polishing (CMP), a capping layer is then deposited over the structure, including over the interconnect itself. The capping layer may be any conventional capping layer such as, for example, $Si_3N_4$, SiC, SiC(N,H). Thereafter, dense dielectric material containing porogens such as, for example, p-SiCOH, is deposited on the structure.

In further steps, a UV cure is performed to burn out the porogens inside the entire dense dielectric material and transform the entire dense dielectric material to "porous". However, by making the entire dense dielectric material porous, the structure presents weak mechanical properties inside the final interconnect structure. In further processing steps, conventional patterning including lithography and etching processes is performed to make vias electrically connected to the underneath interconnect. Conventional metallization and CMP processes are performed, e.g., the interconnect feature is lined with a conventional Cu diffusion barrier and a conductive material such as, for example, Cu, Al, Cu(Al) is filled within the remaining feature.

SUMMARY OF THE INVENTION

In a first aspect of the invention, a method for manufacturing a structure includes depositing a dense dielectric over the entire wafer, which includes areas that require low dielectric capacitance and areas that require high mechanical strength. The method further includes masking areas of the dense dielectric over the areas that require high mechanical strength and curing unmasked areas of the dense dielectric to burn out porogens inside the dense dielectric and transform the unmasked areas of the dense dielectric to porous dielectric material.

In a second aspect of the invention, the method includes forming a metal layer in a dielectric material and a capping layer over the metal layer and the dielectric material. The method further includes depositing a dense dielectric material over the capping layer and masking areas of the dense dielectric over areas that require mechanical strength. The unmasked areas of the dense dielectric are cured to burn out porogens inside the dense dielectric and transform the unmasked areas of the dense dielectric to porous dielectric material. Interconnect structures are formed within vias of the dense dielectric and the porous dielectric material to the metal layer.

In another aspect of the invention, a semiconductor structure comprises porous and dense hybrid interconnects for high performance and reliability semiconductor applications.

DETAILED DESCRIPTION OF EMBODIMENTS OF THE INVENTION

The invention is directed to semiconductor structures and methods for manufacturing, and more particularly to porous and dense hybrid interconnect structures for high performance and reliability semiconductor applications and methods of manufacturing such structure. In embodiments, the structure fabricated using the processes described herein is a hybrid interconnect structure with porous dielectric for high performance required areas and dense dielectric for high reliability required areas. More specifically, in embodiments of the invention, porous dielectric is formed at areas that require low dielectric capacitance for electrical performance improvement, while dense dielectric is used at areas that required high mechanical strength for overall reliability enhancement of the structure. As such, in embodiments, the interconnect structure of the invention contains both dense and porous "hybrid" dielectrics inside a dielectric material for overall BEOL capacitance reduction and reliability enhancement.

The invention also provides methods of forming the hybrid low-k BEOL interconnect structure. The methods are compatible with current BEOL process flow, and as such do not require new module development for creating etching profiles, or handling CMP process. Also, lower cost savings are provided with the invention due to the compatibility with current BEOL process. Additionally, there is no limitation to the use of dielectric material thus providing better technology extendibility as compared with other known methods.

Figure 1:
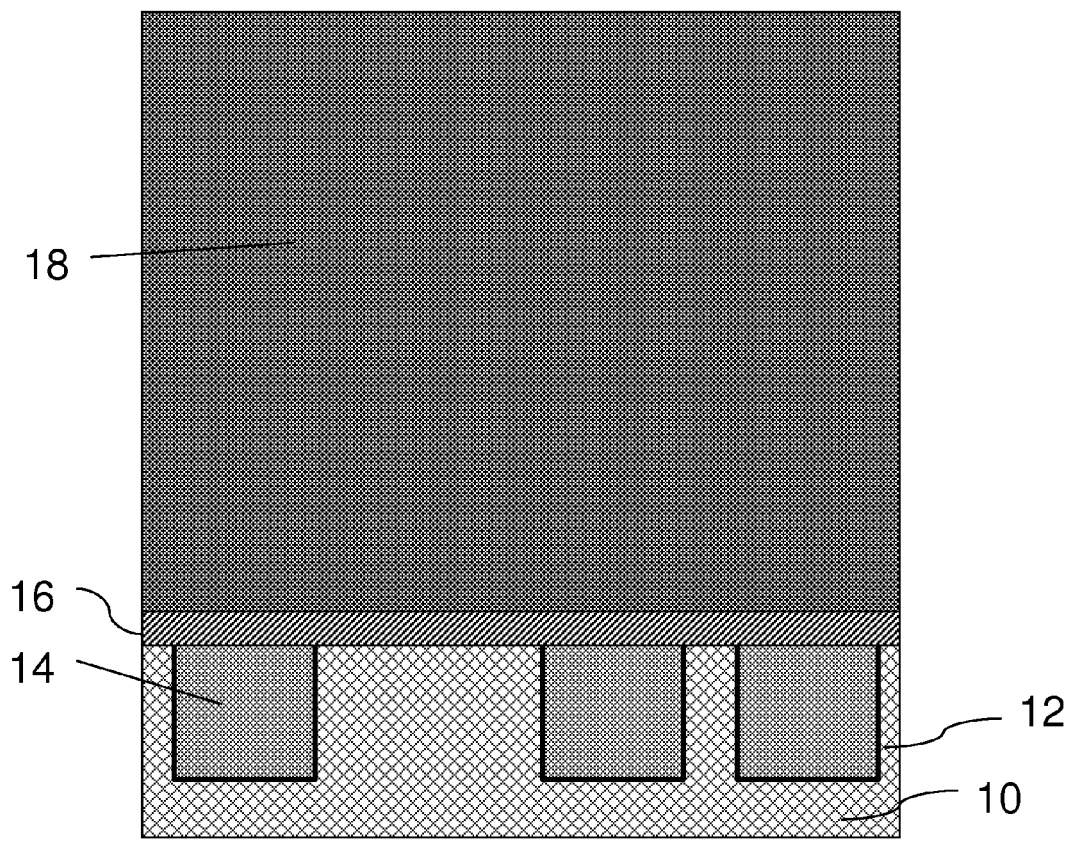
FIG. 1 illustrates a beginning structure according to a first embodiment of the invention.

FIG. 1 shows a starting structure in accordance with an embodiment of the invention. In this starting structure, an insulator layer 10 is patterned in a conventional manner such as using conventional lithography and etching methods. In embodiments, the insulator layer 10 is a low-k dielectric material with a thickness between 500 Å to 9000 Å. The low-k dielectric material may be, for example, SiLK, SiCOH, SiO$_2$ or other low-k dielectrics. In embodiments, the low-k dielectric material has a value of below 4, for example. A diffusion barrier layer (liner) 12 lines the pattern of the insulator 10. The diffusion barrier layer 12 may be, for example, Ta(N), Ti(N) or Ru(N).

An electrically conductive material 14, e.g., interconnect structure, is deposited over the diffusion barrier layer 12, in a conventional manner. In this manner, the barrier layer 12 is provided between the electrically conductive material 14 and the insulator 10. The electrically conductive material 14 may be, for example, Cu, Al, Al(Cu) or W. A capping layer 16 is formed over the structure by using any conventional processes such as, for example, CVD or spin on processes. The capping layer 16, in embodiments, comprises Si$_3$N$_4$, SiC or SiC(N,H) and may have a thickness in the range of, for example, about 50 Å to 800 Å. A dense dielectric 18 with porogens, e.g., p-SiCOH, is formed over the structure in a conventional manner such as, for example, spin on or CVD processes.

Figure 2:
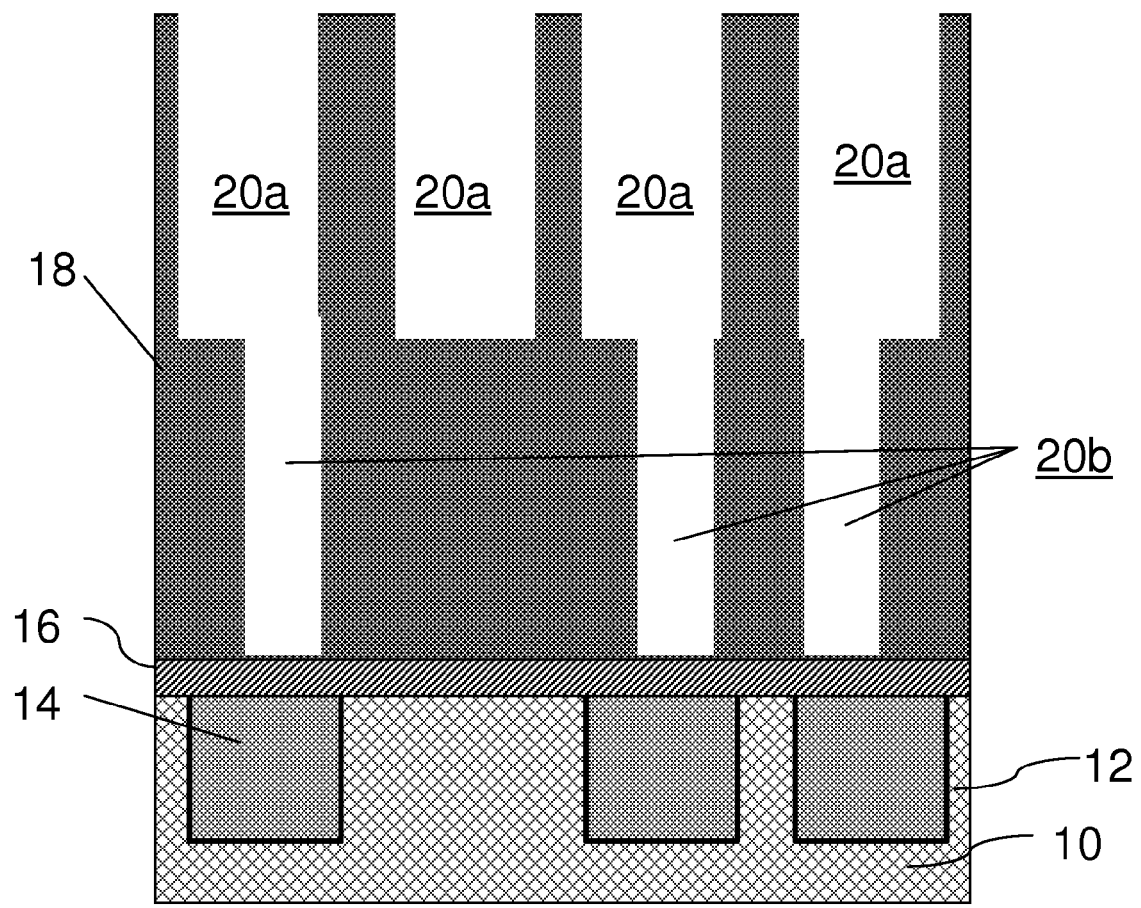
FIGS. 2-7 represent process steps in accordance with the first embodiment of the invention.

FIG. 2 shows additional processing steps in accordance with the invention. In these processing steps, a dual damascene patterning is performed by conventional lithography and etching processes. As a result, trenches 20a and vias 20b are formed in the dense dielectric 18. Depending on the etching rate, the resultant vias 20b may be formed to the capping layer 16.

Figure 3:
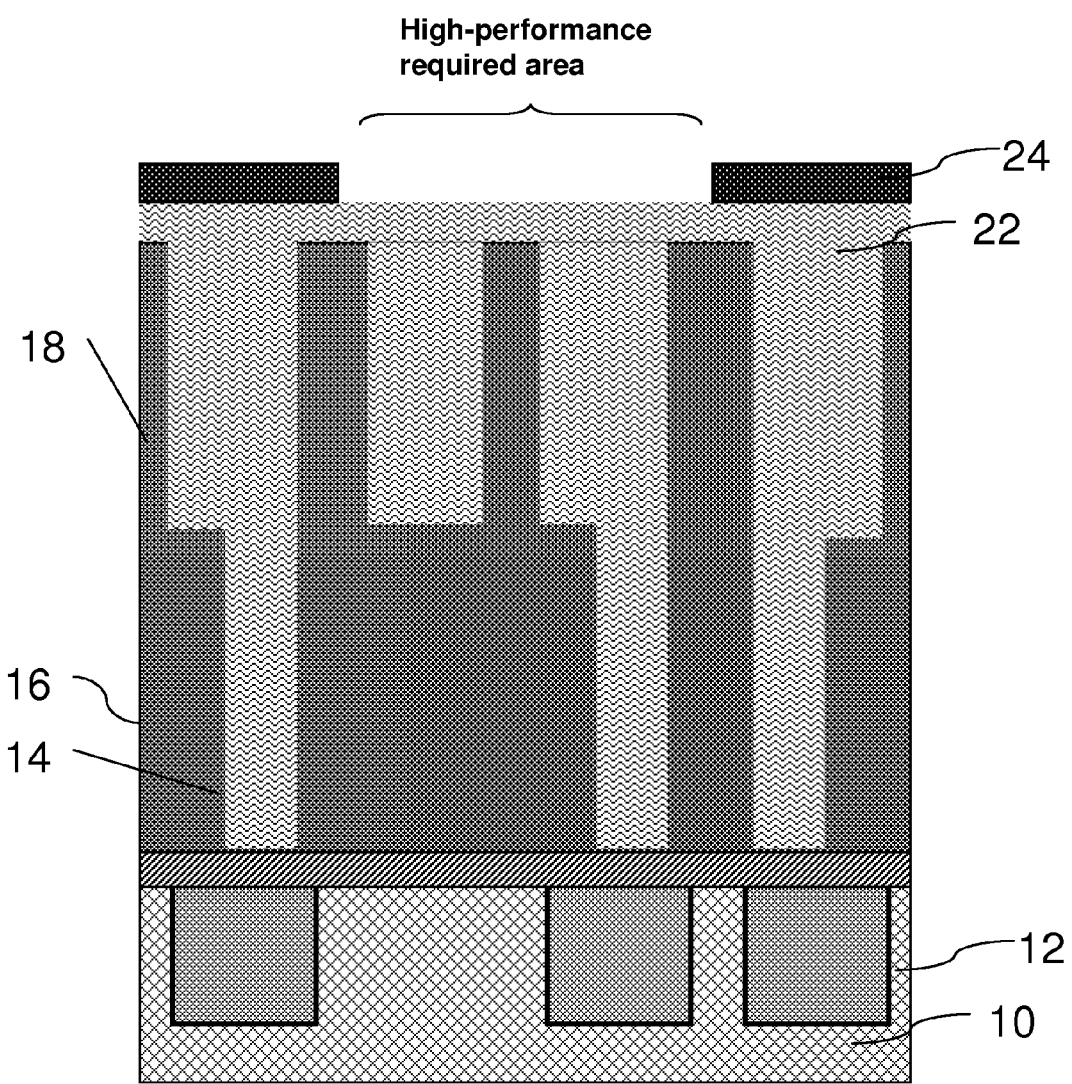

FIG. 3 shows additional processing steps in accordance with the invention. In embodiments, a spin on organic material 22 is formed within the trenches 20a and vias 20b. The spin on organic material 22 is planarized and a mask 24 is then formed over the areas of the structure, including portions of the planarized spin on organic material 22. The mask 24 is used to define the areas of the structure with high performance; that is, the mask 24 defines areas of lower dielectric capacitance. In embodiments, the mask 24 is a silicon oxide or nitride hard mask formed in any conventionally known manner.

Figure 4:
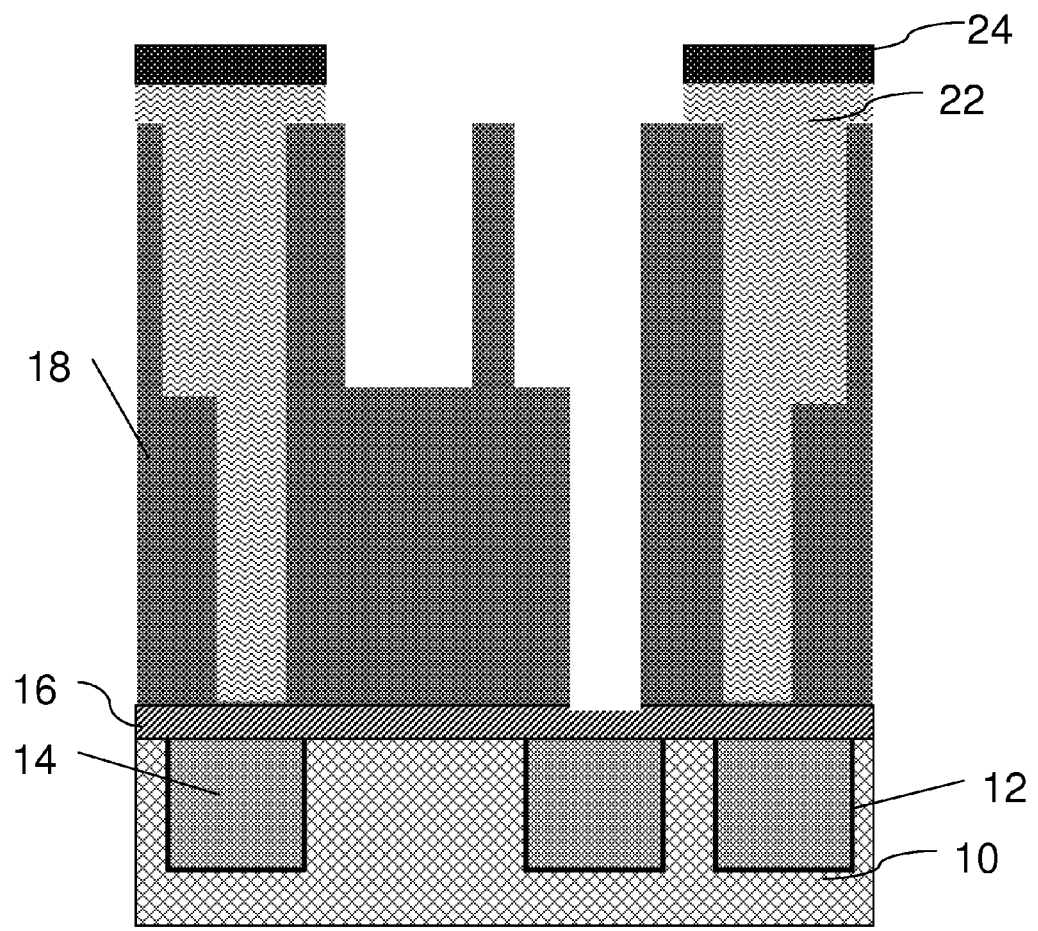

FIG. 4 represents another processing step in accordance with the invention. In this processing step, the spin on organic material 22 in the high-performance area is stripped using any known conventional method. For example, the spin on organic material 22 may be stripped via a wet or plasma etching process, well known to those of skill in the art. The stripping of the spin on organic material 22 results in trenches 20a and vias 20b in the high-performance area.

Figure 5:
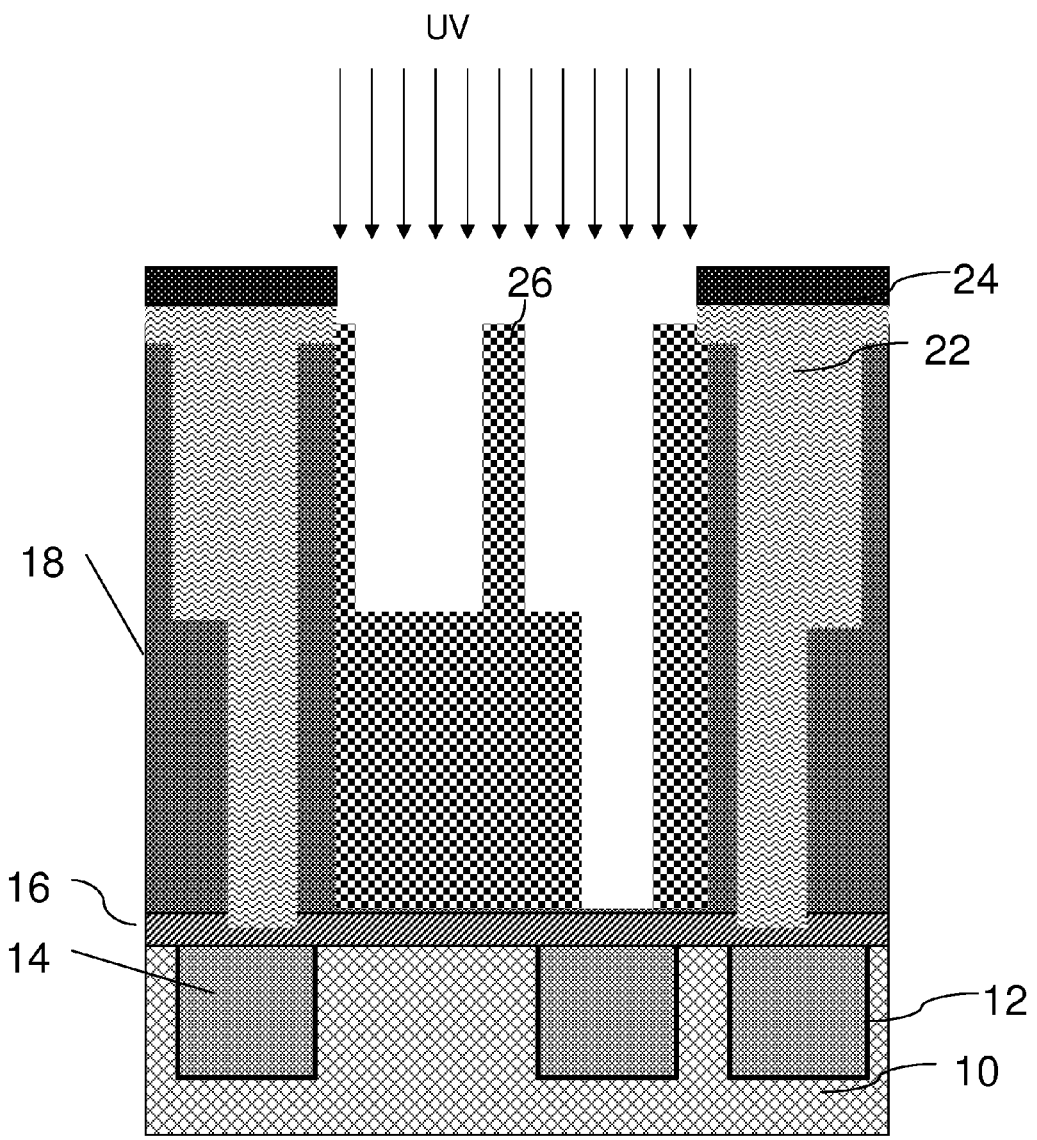

FIG. 5 shows another processing step in accordance with the invention. In this processing step, a UV cure is used to burn out porogens at the high-performance required areas. UV cure can be performed in a conventional UV cure tool and the structure is then subjected to a UV exposure step at a substrate temperature from about 200° to about 450° C., preferably 400° C. The UV exposure step is performed utilizing a source that can generate light having a wavelength from about 150 to about 500 nm, preferably from about 190 to about 250 nm, to irradiate the surface, especially the exposed surface of the dielectric. The UV exposure step is performed for a time period from about 0.5 to about 100 minutes. The UV exposure may be performed in the presence of an ambient gas such as an inert gas including, for example, He, Ar, Xe, N$_2$ or a mixture thereof such as a forming gas N$_2$/O$_2$. Optionally, a chemically active gas may be added to the inert gas. Examples of chemically active gases that can optionally be used in the present invention include: H$_2$, CH$_4$, trimethylsilane, ethylene or silane derivatives having the formula HSiRR$_1$R$_2$ wherein R, R$_1$ and R$_2$ may be the same or different and are selected from group consisting of methyl, ethyl, propyl, vinyl, allyl, methoxy and ethoxy.

This curing process creates a porous dielectric 26. In this manner, in embodiments, the porous dielectric 26 can be created for use at areas that require low dielectric capacitance for electrical performance improvement, while the remaining dense dielectric remains, intact, and is used at areas that require high mechanical strength for overall reliability enhancement. Accordingly, it is now possible to have a semiconductor structure with both porous and dense hybrid interconnect structures for high performance and reliability semiconductor applications.

Figure 6:
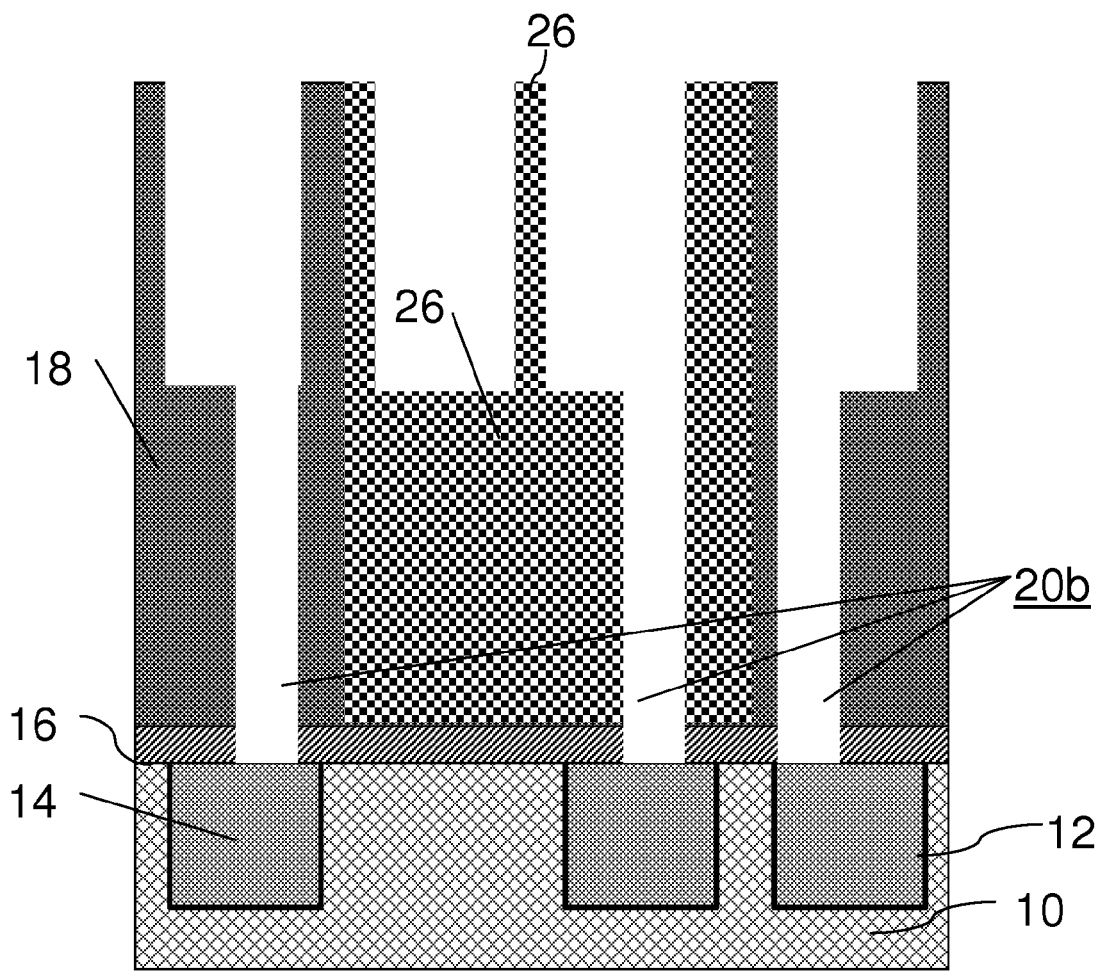

In FIG. 6, the hard mask 24 is removed and the spin on organic material 22 is strip out from the structure. The removal of the spin on organic material 22 opens the capping layer 16. This allows for subsequent physical interconnection of metal to the underneath interconnect layer 14.

Figure 7:
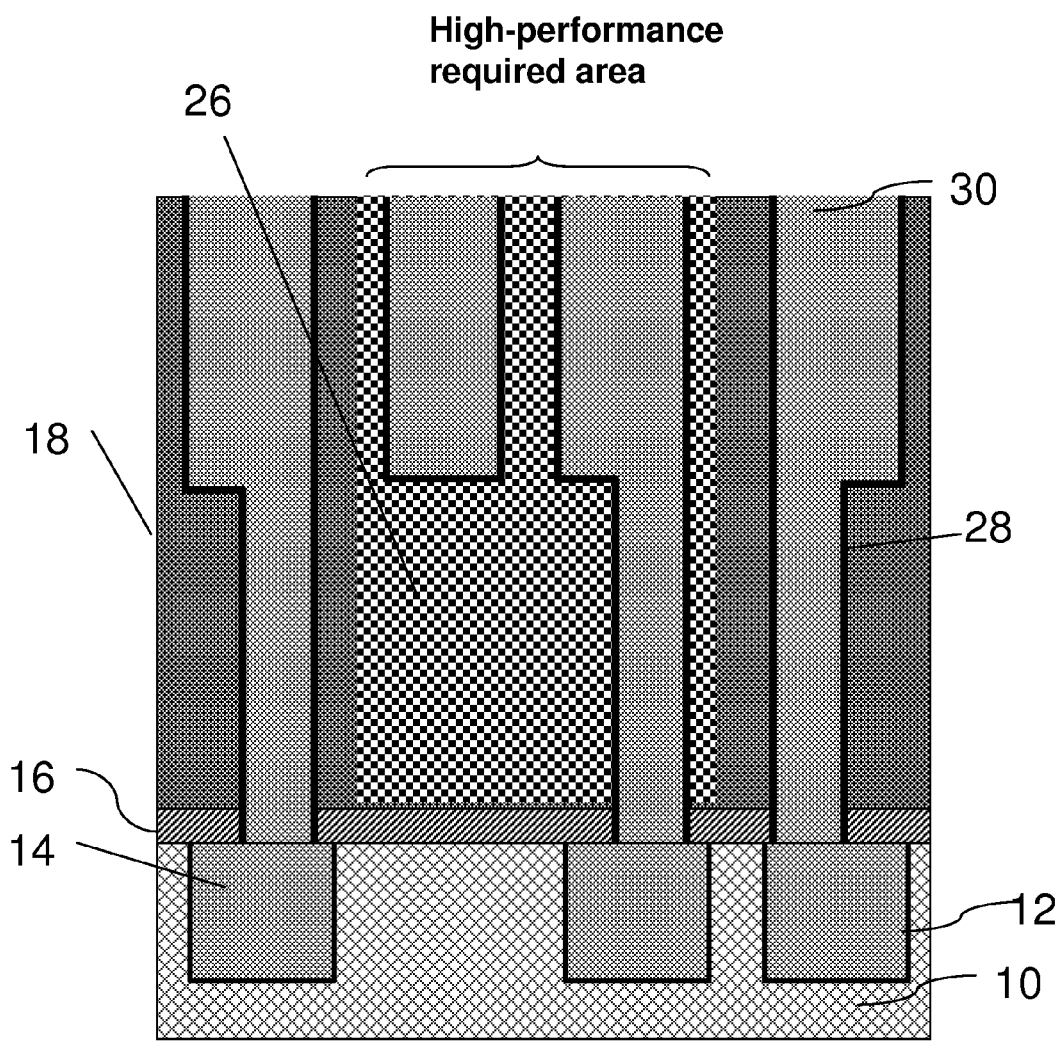

FIG. 7 represents further processing steps in accordance with the invention. In further steps, metallization and CMP processes are performed, e.g., the trenches 20a and vias 20b are lined with a conventional Cu diffusion barrier 28, and a conductive material 30 such as, for example, Cu, Al, Cu(Al), is formed within the lined trenches 20a and vias 20b. In embodiments, the interconnect 30 will make electrical contact with the metal interconnect layer 14, through the via(s) 20b. In this structure, strong mechanical properties can now achieved using the dense dielectric inside the final interconnect structure, while the porous dielectric is used at areas that require low dielectric capacitance for electrical performance improvement.

Figure 8:
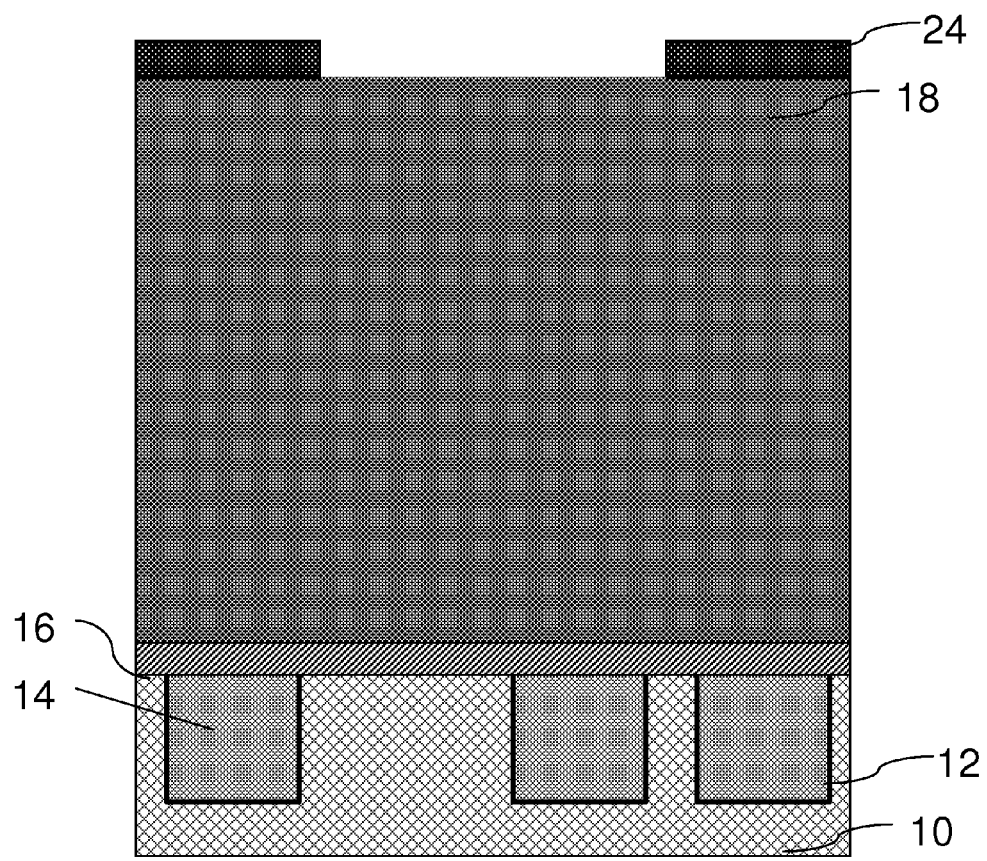
FIG. 8 illustrates a beginning structure according to a second embodiment of the invention.

FIG. 8 shows a beginning structure according to a second embodiment of the invention. In the starting structure of FIG. 8, an insulator layer 10 is patterned in a conventional manner as described above. In embodiments, the insulator layer 10 is a low-k dielectric material with a thickness between 500 Å to 9000 Å. The low-k dielectric material may be, for example, SiLK, SiCOH, SiO$_2$ or other low-k dielectrics. In embodiments, the low –k dielectric should have a k value of less than 4, for example. A diffusion barrier layer 12 lines the patterned insulator 10. The diffusion barrier layer 12 may be, for example, Ta(N), Ti(N) or Ru(N).

An electrically conductive material 14, e.g., interconnect structure, is deposited over the diffusion barrier layer 12, in a conventional manner. The electrically conductive material 14 may be, for example, Cu, Al, Al(Cu) or W. A capping layer 16 is then formed over the structure. The capping layer 16 may be formed in any conventional manner such as, for example, CVD or spin on processes, as described above. The capping layer 16, like that described above, in embodiments, comprises Si$_3$N$_4$, SiC or SiC(N,H) and may have a thickness in the range of, for example, about 50 Å to 800 Å. A dense dielectric 18 with porogens, e.g., p-SiCOH, is then formed over the structure in a conventional manner.

Still referring to FIG. 8, a hard mask 24 is formed over the structure to define the areas of the structure with high performance; that is, the mask 24 defines areas of lower dielectric capacitance. In embodiments, the mask 24 is a silicon oxide or nitride hard mask, and is formed in any conventionally known manner to those of skill in the art.

Figure 9:
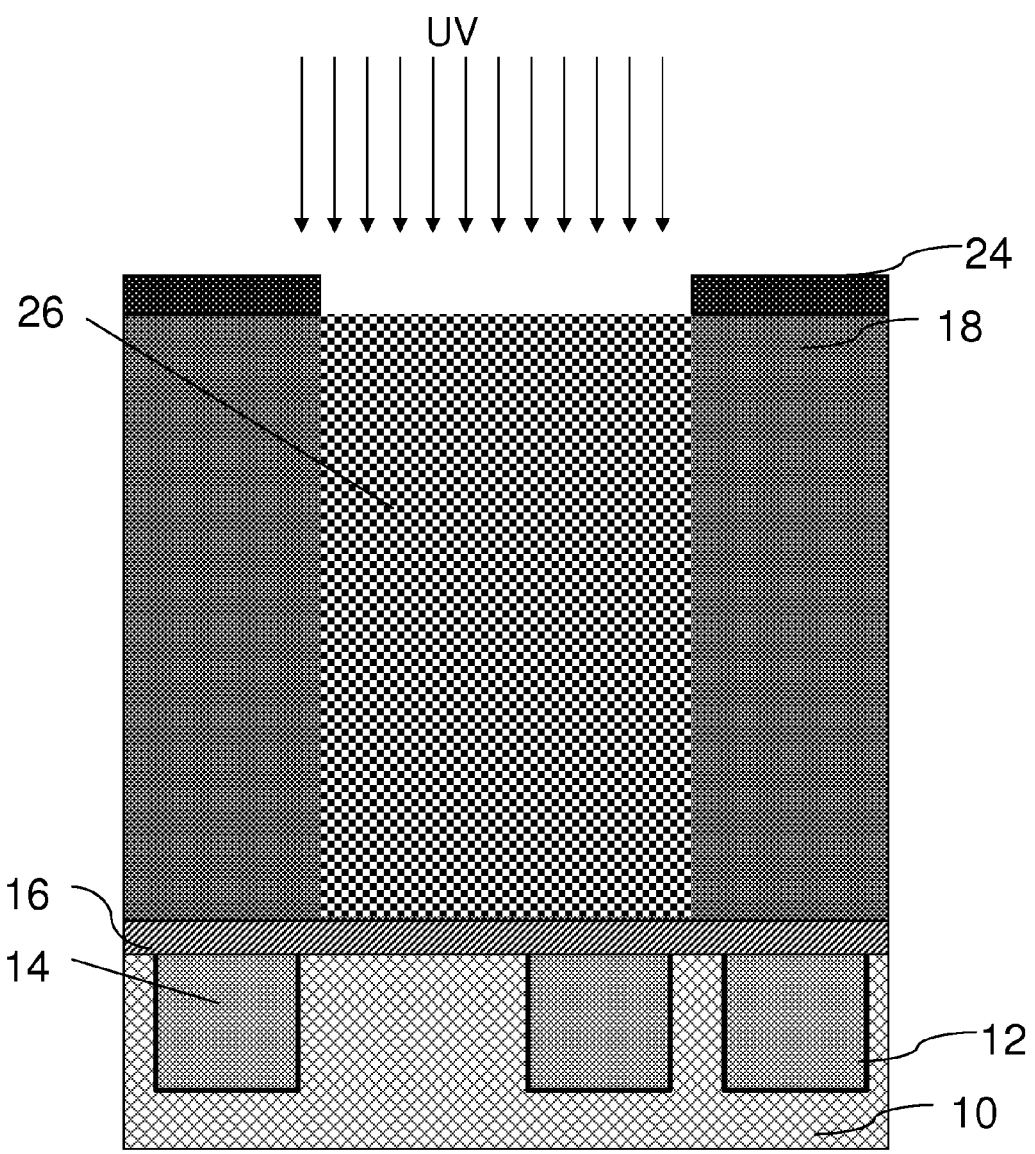
FIGS. 9-12 represent process steps in accordance with the second embodiment of the invention.

FIGS. 9-12 represent further process steps in accordance with the second embodiment of the invention. In FIG. 9, a UV cure is used to burn out porogens at the high-performance required areas, as previously described with reference to FIG. 5. This UV process creates a porous dielectric 26. In this manner, in embodiments, porous dielectric can be created for use at areas that require low dielectric capacitance for electrical performance improvement, while dense dielectric remains, intact, and can be used at areas that required high mechanical strength for overall reliability enhancement. Accordingly, in this embodiment, it is also possible to have a semiconductor structure with both porous and dense hybrid interconnect structures for high performance and reliability semiconductor applications.

Figure 10:
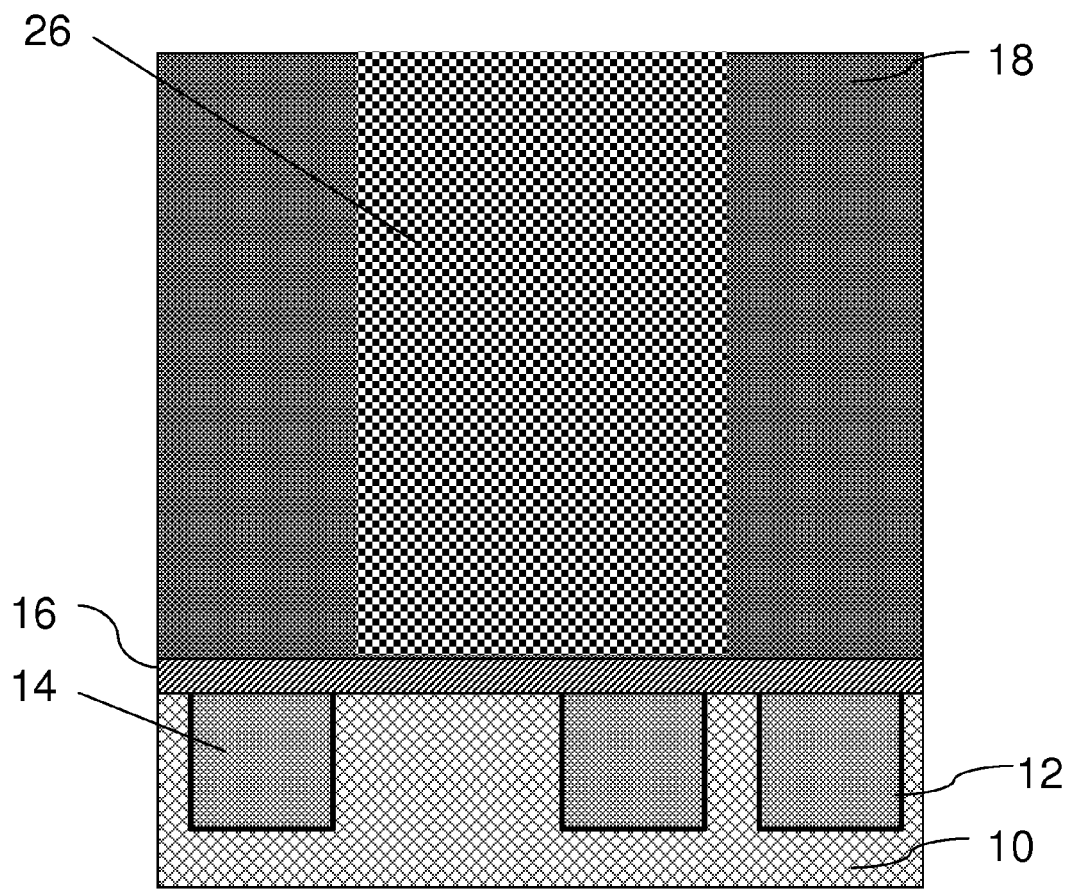
Figure 11:
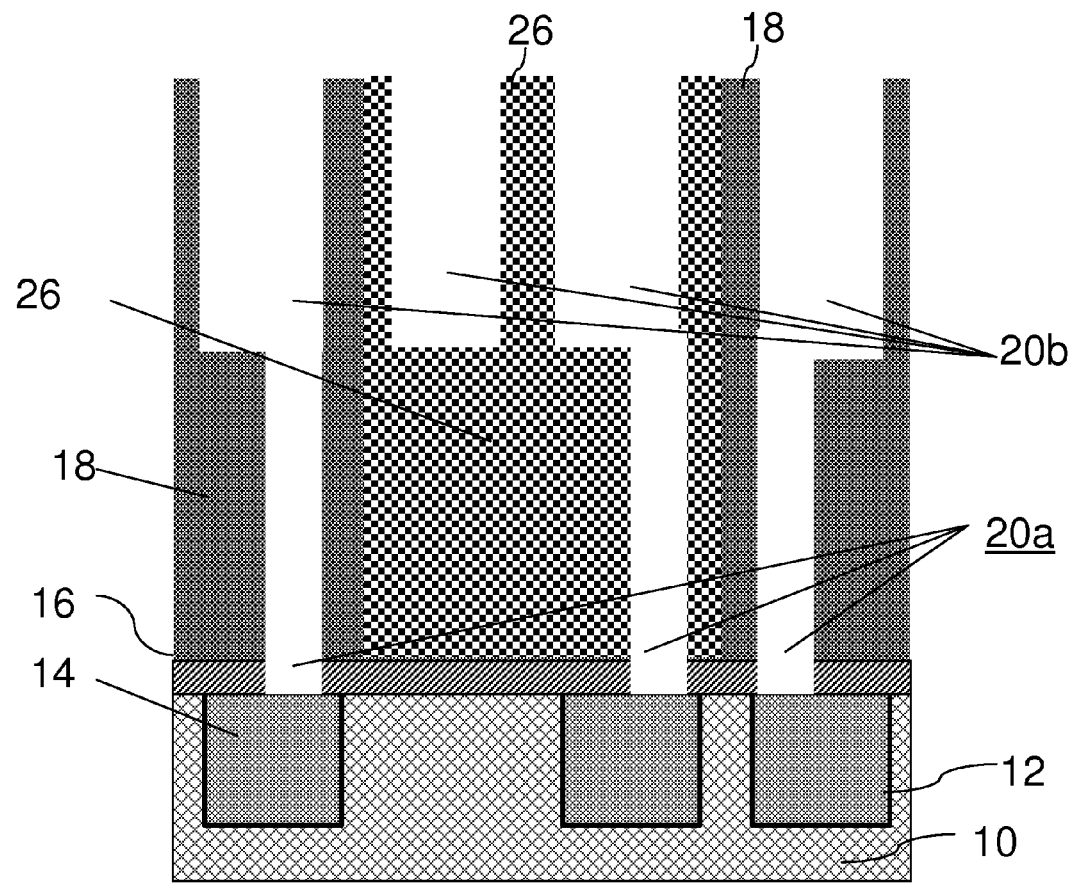

In FIG. 10, the hard mask 24 is stripped in a conventional manner. In FIG. 11, a dual damascene patterning is performed by conventional lithography and etching processes. As a result of this processing, trenches 20a and vias 20b are formed in the dense dielectric 18 and the porous dielectric 26. Depending on the etching rate, the resultant vias 20b may etch through the capping layer 16 to the underlying layer 14.

Figure 12:
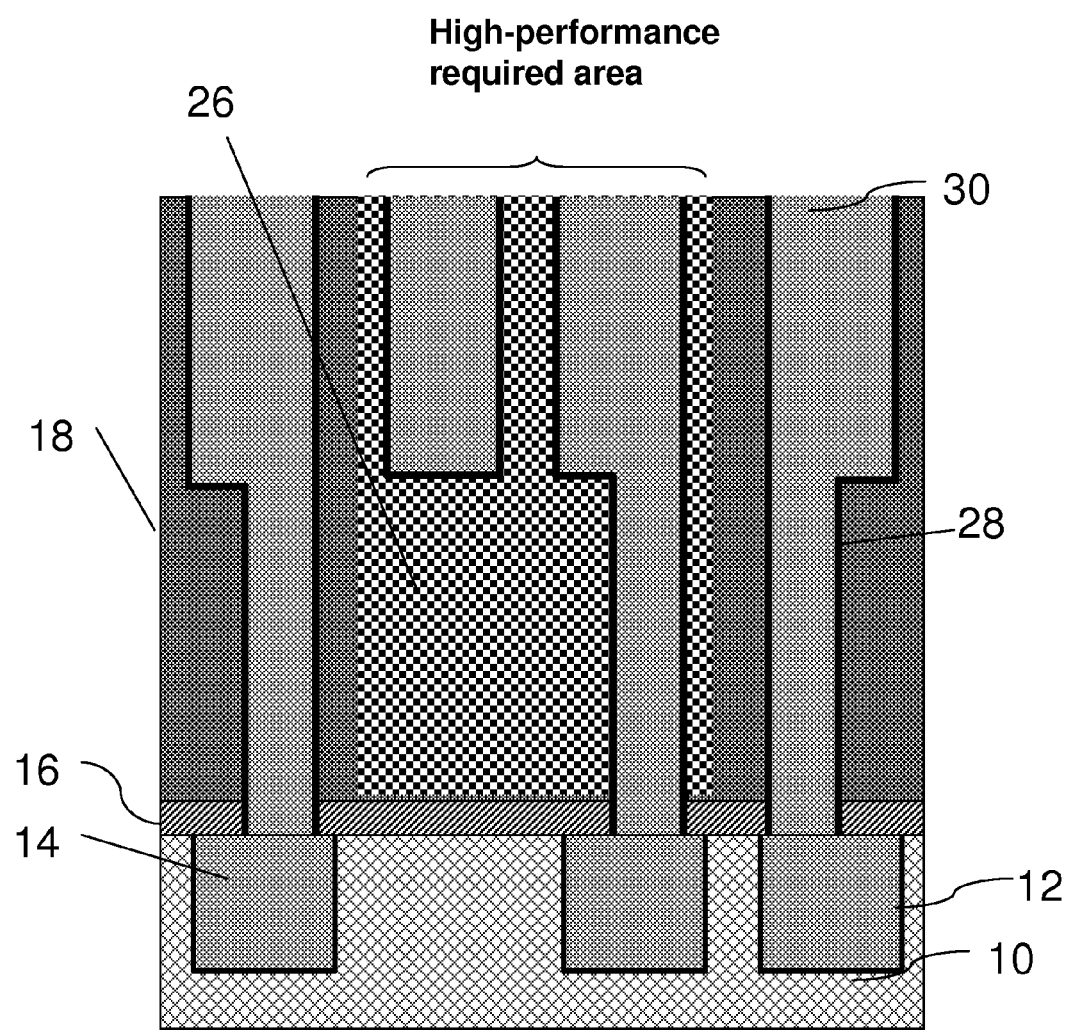
Figure 13:
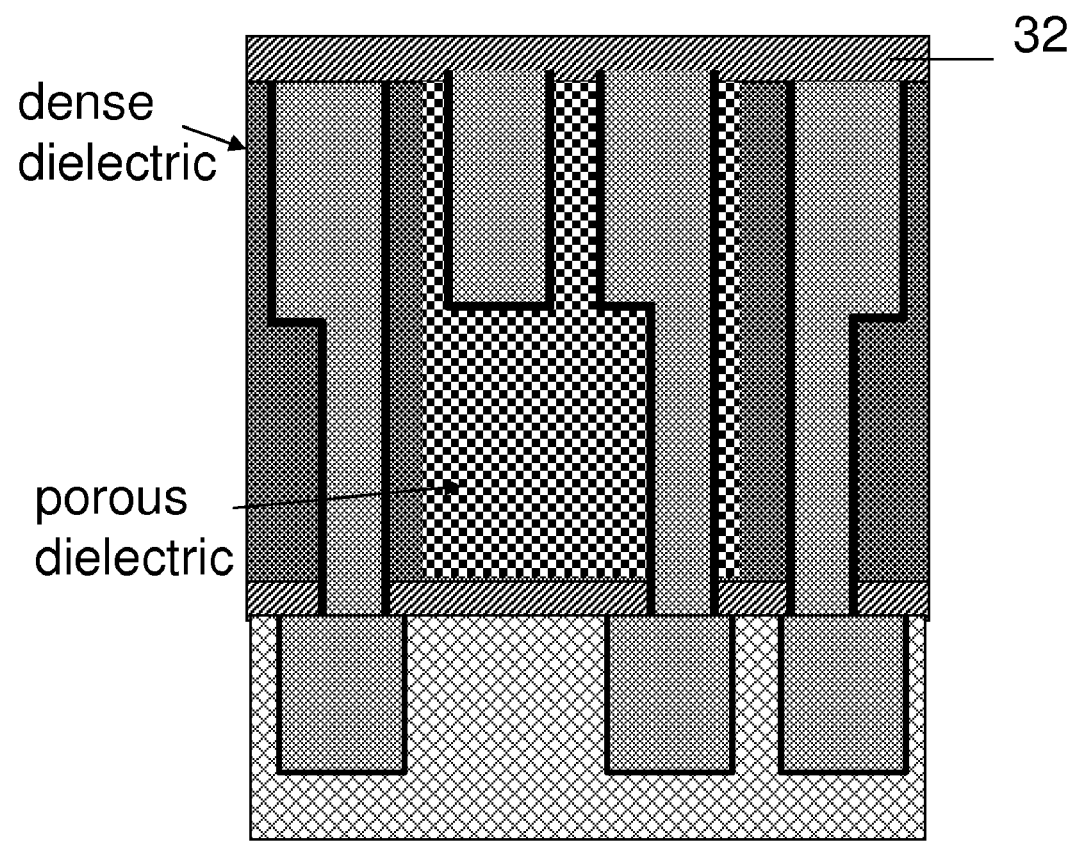
FIGS. 13 and 14 show cross-sectional and top-down views, respectively, of an embodiment of a final structure fabricated in accordance with the methods of the invention.
Figure 14:
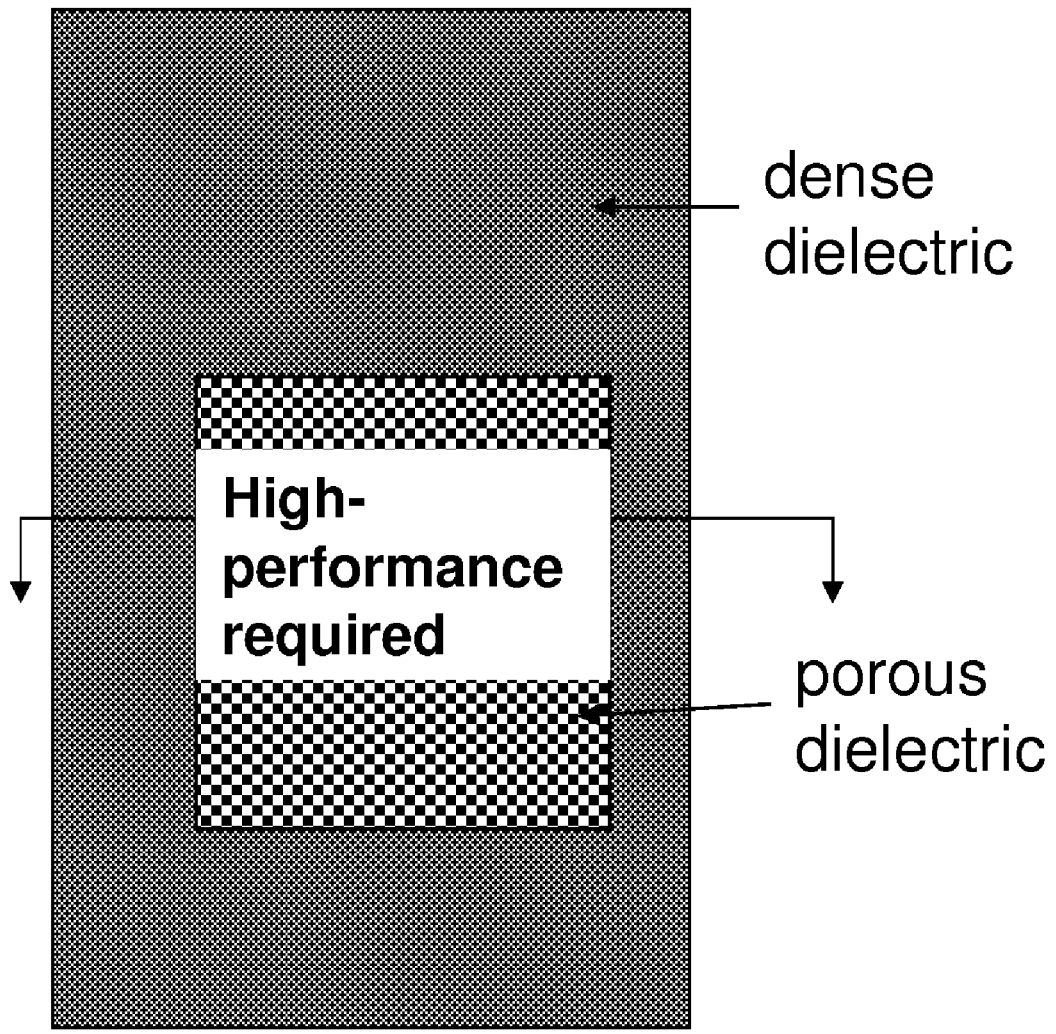

FIG. 12 shows a further processing step in accordance with the processes of the invention. In further steps, metallization and CMP processes are performed, e.g., the trenches 20a and vias 20b are lined with a conventional Cu diffusion barrier 28 and a conductive material 30 such as, for example, Cu, Al, Cu(Al) is formed within the lined trenches 20a and vias 20b. The interconnect 30 may be planarized using a conventional process such as, for example, CMP. In this structure, strong mechanical properties can also be achieved using a dense dielectric inside the final interconnect structure, while porous dielectric is used at areas that require low dielectric capacitance for electrical performance improvement FIGS. 13 and 14 are final structures in accordance with the processing steps of either the embodiment of FIGS. 1-7 or the embodiment of FIGS. 8-12. In this final structure, a capping material 32 is formed over the structure. This capping material 32 is formed in a conventional manner, as described with reference to capping layer 16. In embodiments, the capping layer 32 can be used for forming a base of another structure, in the manner described above. In this way, the processes as described with reference to the above embodiments can be repeated to form a stacked structure.

It should be understood by those of skill in the art that the present invention provides an interconnect structure for high volume manufacturable chips with both properties of high performance and high reliability. The structure and processes described herein also provide other value such as, for example, low cost manufacturing which is compatible with current BEOL flow processes and increased technology extendibility. Since the present invention is compatible to current BEOL process flow, the processes described herein do not require new module development for creating etching profiles, etc.

Additionally, the method as described herein is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in terms of embodiments, those skilled in the art will recognize that the invention can be practiced with modification within the spirit and scope of the appended claims.

What is claimed is:

1. A method for manufacturing a structure, comprising:
   depositing a dense dielectric over areas of a structure that require low dielectric capacitance and areas that require mechanical strength;
   masking areas of the dense dielectric over the areas that require mechanical strength; and
   curing unmasked areas of the dense dielectric to burn out porogens inside the dense dielectric and transform the unmasked areas of the dense dielectric to porous dielectric material.

2. The method of claim 1, wherein the curing is a UV curing.

3. The method of claim 1, further comprising forming vias in the dense dielectric and the porous dielectric for the formation of interconnect structures to an underlying metal layer.

4. The method of claim 3, wherein one of:
   the masking and curing is performed prior to the forming of the vias; and
   the masking and curing is performed after the forming of the vias.

5. The method of claim 1, wherein the masking is a hard mask of oxide or nitride.

6. The method of claim 1, further comprising performing a dual damascene patterning by lithography and etching processes to form vias and trenches in the dense dielectric.

7. The method of claim 6, further comprising performing a dual damascene patterning by lithography and etching processes to form the vias and trenches in the porous dielectric.

8. The method of claim 1, further comprising:
   forming vias and trenches in the dense dielectric and the porous dielectric;
   lining the vias and trenches with a barrier; and
   depositing an electrically conductive material in the vias and trenches over the barrier to form interconnect structures to an underlying metal layer.

9. The method of claim 8, further comprising forming a capping layer over a structure formed by the steps of claim 8.

10. The method of claim 1, further comprising:
    forming trenches and vias in the dense dielectric prior to the masking;
    forming a spin on organic material within the trenches and the vias;
    planarizing the spin on organic material; and
    stripping the spin on organic material in the trenches and the vias of the unmasked areas, wherein
    the masking is formed over the planarized spin on organic material and remaining portions of the dense dielectric to define the areas of the structure requiring mechanical strength, and
    the curing of the unmasked areas of the dense dielectric to burn out the porogens to form the porous dielectric is provided after the forming trenches and vias.

11. The method of claim 1, further comprising:
    forming trenches and vias in the dense dielectric and the porous dielectric after the masking;
    forming a spin on organic material within the trenches and the vias; and
    planarizing the spin on organic material, wherein
    the masking is stripped prior to the planarizing of the spin on organic material, and the curing of the unmasked areas of the dense dielectric to burn out the porogens to form the porous dielectric is provided prior to forming the trenches and vias.

12. A method of forming a hybrid structure, comprising:
forming a metal layer in a dielectric material;
forming a capping layer over the metal layer and the dielectric material;
depositing a dense dielectric material over the capping layer;
masking areas of the dense dielectric over areas that require mechanical strength;
curing unmasked areas of the dense dielectric to burn out porogens inside the dense dielectric and transform the unmasked areas of the dense dielectric to porous dielectric material; and
forming interconnect structures within vias formed in the dense dielectric and the porous dielectric material to the metal layer.

13. The method of claim 12, further comprising forming vias and trenches in the dense dielectric prior to the masking.

14. The method of claim 13, wherein the curing of the unmasked areas of the dense dielectric to burn out the porogens to form the porous dielectric is provided prior to forming the trenches and the vias.

15. The method of claim 12, wherein the forming interconnect structures comprises:
forming trenches and vias in the dense dielectric and the porous dielectric after the masking;
forming a spin on organic material within the trenches and the vias; and
planarizing the spin on organic material, wherein
the masking is stripped prior to the planarizing the spin on organic material, and
the curing of the unmasked areas of the dense dielectric to burn out the porogens to form the porous dielectric is provided prior to forming the trenches and vias.

16. The method of claim 12, wherein the forming interconnect structures comprises:
forming trenches and vias in the dense dielectric prior to the masking;
forming a spin on organic material within the trenches and the vias;
planarizing the spin on organic material; and
stripping the spin on organic material in the trenches and the vias of the unmasked areas, wherein
the masking is formed over the planarized spin on organic material and remaining portions of the dense dielectric to define the areas requiring mechanical strength, and
the curing of the unmasked areas of the dense dielectric to burn out the porogens to form the porous dielectric material is provided after the forming trenches and vias.

17. A semiconductor structure, comprising porous and dense hybrid interconnect structures for high performance and reliability semiconductor applications,
wherein the porous and dense hybrid interconnect structures are formed in a same level,
one of the interconnect structures comprises barrier material contacting a porous dielectric material,
another one of the interconnect structures comprises barrier material contacting a dense dielectric material, and
the porous dielectric material comprises dielectric material in which porogens have been burned out.

* * * * *